United States Patent [19]
Pellet et al.

[11] Patent Number: 5,306,345
[45] Date of Patent: Apr. 26, 1994

[54] DEPOSITION CHAMBER FOR DEPOSITION OF PARTICLES ON SEMICONDUCTOR WAFERS

[75] Inventors: Carrie Pellet; Craig Donaldson, both of Charlotte, N.C.

[73] Assignee: Particle Solutions, Charlotte, N.C.

[21] Appl. No.: 935,043

[22] Filed: Aug. 25, 1992

[51] Int. Cl.$^5$ .......................................... B05B 15/06
[52] U.S. Cl. ..................... 118/301; 118/308; 118/326; 118/500; 118/504; 427/282; 269/21; 269/903; 437/225
[58] Field of Search ............... 118/301, 326, 500, 504, 118/505, DIG. 7, 720, 721, 722, 723 R, 723 VE, 728, 308; 204/192.25, 298.11, 298.15, 298.07; 437/225; 427/255, 282; 269/21, 903

[56] References Cited

U.S. PATENT DOCUMENTS

| | | | |
|---|---|---|---|
| 2,239,770 | 4/1941 | Becker et al. | 118/721 |
| 3,063,867 | 11/1962 | Emery, Jr. | 118/301 |
| 3,499,714 | 3/1970 | Schellenberg | 269/21 |
| 3,731,650 | 5/1973 | Schweikert et al. | 239/543 |
| 4,375,487 | 3/1983 | Huber | 427/195 |
| 4,397,078 | 8/1993 | Imahashi | 29/574 |
| 4,544,311 | 10/1985 | Husain | 269/21 |
| 4,547,958 | 10/1985 | Hufford | 29/572 |
| 4,575,922 | 3/1986 | Nemiroff | 29/574 |
| 4,599,558 | 7/1986 | Castellano, Jr. et al. | 324/158 R |
| 4,605,893 | 8/1986 | Braslau | 324/58.5 B |
| 4,676,193 | 6/1987 | Martin | 118/720 |
| 4,825,809 | 5/1989 | Mieno | 118/725 |
| 4,962,727 | 10/1990 | Harada | 118/723 R |
| 4,989,541 | 2/1991 | Mikoshiba et al. | 118/723 |
| 5,035,750 | 7/1991 | Tada et al. | 134/1 |
| 5,042,421 | 8/1991 | Anbe | 118/500 |
| 5,042,423 | 8/1991 | Wilkinson | 118/500 |
| 5,180,435 | 1/1993 | Markunas et al. | 118/722 |
| 5,194,297 | 3/1993 | Scheer et al. | 118/308 |

FOREIGN PATENT DOCUMENTS

| | | | |
|---|---|---|---|
| 654258 | 5/1963 | Italy | 269/21 |
| 55-88327 | 7/1980 | Japan | 269/21 |
| 61-202139 | 9/1986 | Japan | 118/318 |
| 61-240645 | 10/1986 | Japan | 118/308 |
| 2-312259 | 12/1990 | Japan | 269/21 |

OTHER PUBLICATIONS

Georg Schurmann, "Measurement Techniques for Hepa-Filters in the Range from 0.03 Micrometers-1 Micrometer.", undated.
David Y. H. Pui and Benjamin Y. H. Liu, "Aerosol Generation and Calibration of Instruments," TSI Quarterly, vol. V, No. 2, May/Jun. 1979, pp. 5-12 undated.
Benjamin Y. H. Liu and K. W. Lee, "An Aerosol Generator of High Stability," American Industrial Hygiene Assoc. Journal, Dec. 1975, pp. 861-865, undated.
Jugal K. Agarwal and Gilmore J. Sem, "Generating Submicron Monodisperse Aerosols for Instrument Calibration", TSI Quarterly, vol. IV, No. 2, May/Jun. 1978, pp. 3-8.
B. R. Locke and R. P. Donovan, "Particle Sizing Uncertainties in Laser Scanning of Silicon Wafers (Calibration/Evaluation of the Aeronca Wafer Inspection System 150)" undated.
Japanese study (2 pages) undated.

*Primary Examiner*—Joseph W. Drodge
*Attorney, Agent, or Firm*—Shefte, Pinckney & Sawyer

[57] ABSTRACT

A deposition chamber for forming a deposited layer on a wafer having a mixing chamber is disclosed having a wafer support device for supporting the wafers in the mixing chamber, a nozzle located above the wafer support device which can eject the gas/particle mixture into the mixing chamber toward the wafer, a gas outlet device at the bottom end of the chamber from the gas nozzle which allows the gas to exit the chamber and a deionizing device located above the wafer support device and below the nozzle to deionize the gas/particle mixture thereby encouraging uniform deposition of the particles on the wafer. This deposition chamber may also comprise an exhaust fan below the gas outlet device.

18 Claims, 9 Drawing Sheets

DEPOSITION CHAMBER FOR DEPOSITION OF PARTICLES ON SEMICONDUCTOR WAFERS

FIELD OF THE INVENTION

This invention relates to the deposition of particles on semiconductor wafers or other substrates.

BACKGROUND OF THE INVENTION

Semiconductors are manufactured to close tolerances on very clean surfaces. These surfaces, typically silicon or gallium arsenide, are in the form of wafers that are manufactured in standard sizes of 2, 3, 4, 5, 6, 8, and 10 inches in diameter. Industry standards dictate that these pure crystalline wafers be of a certain thickness, resistivity, etc. These wafers are handled from the backside only by the means of a vacuum wand. They are kept sealed until they are used and can only be opened in a clean room environment to ensure that they are not contaminated by particles and other foreign materials that affect yield levels.

Many companies use optical surface inspection machines that use a laser or other technique to scan these wafers for particle contamination that cannot be seen without the use of a microscope or a SEM (Scanning Electron Microscope). Wafers are scanned for certain particle count levels and, if acceptable, they are used to build semiconductors on. If they are dirty, the wafers are cleaned and reinspected for contamination. If the wafers cannot be cleaned, they are scrapped because the cost of further processing exceeds the value of the wafer yield(s).

To guarantee accurate count estimates, optical surface inspection systems must be calibrated with standard particle size artifacts, such as polystyrene latex (PSL) spheres. A surface particle sizing standard is created when monosized PSL spheres that are traceable to the National Institute of Science and Technology are deposited onto the substrate of interest, e.g., bare silicon, silicon with a thin film coating, a patterned silicon wafer, a photomask or a disk.

In these systems, the sizing standard or wafer is scanned by a surface inspection instrument to determine the optical light scattering of the spheres deposited on the specific substrate. The amount of light scattered is then related to the size of the sphere deposited. When many substrates, such as wafers, are deposited with many different sphere sizes, one may calibrate the inspection machine across its entire dynamic range for that specific substrate type. The dynamic range of an instrument is the range over which particle sizes can be resolved from each other for a given substrate type. The ability to measure and resolve particles on substrates is important in the manufacture of many substrate types, but particularly in the production of semiconductors. The geometry of a given integrated circuit design dictates the sensitivity of a device to particles during manufacturing. The more integrated and dense the geometry, the smaller the particle size that can cause device failure, or functional yield loss. A 10:1 design rule is often used to identify particle sizes which can cause device failure, i.e., particles 1/10th the size of the geometry.

Most integrated circuit manufacturers produce several different device geometries and integration levels, thus each has different contamination limits. Surface inspection systems must therefore be set up with substrate particle sizing standards for each device type to provide relevant process control information to decision-makers and to provide an adequate return-on-investment in the inspection system itself.

One technique to apply monosized PSL sphere artifacts on the wafer (or other) surface incorporates chemical vapor deposition (CVD) principles. Typically, in such a deposition scheme, a colloidal suspension of PSL spheres of a known size distribution is made from concentrated spheres and surfactants diluted with ultra-pure deionized water. This suspension is atomized with an atomizer to produce an aerosol. The atomizer is typically designed for sizes of spheres from 0.005 micron to 1.0 micron in diameter. Such atomizers are designed to produce droplets of water that ideally contain one sphere per drop. Next, the atomized droplets leave the atomizer and flow through a line or tube to a glass expansion air dryer comprised of a connected series of four glass bulbs. The output of the glass dryer is a dry air/sphere mixture that is either reprocessed through the dryer if any visible moisture is evident or continues on to an optional electrostatic classifier. The classifier uses electrostatic forces to separate all incoming particles based on the electric mobility of each individual particle.

The dry air/sphere mixture then enters the deposition chamber and is dispersed by a nozzle at the top of the deposition chamber. The PSL spheres are pushed by the constant output from the nozzle toward the wafers which are positioned on deposition plates at the bottom of the chamber.

Existing deposition systems including systems for the deposition of these latex spheres have a number of drawbacks making them unsuited to commercial or research applications. For example, the available deposition plates for latex sphere deposition do not allow for batch processing, i.e., only one wafer fits in the deposition chamber at a time. Moreover, when only one half of the wafer is to be processed, the space between the wafer and the mask covering the half of the wafer is so large that some of the deposition material (latex spheres) can rebound off the uncovered portion of the wafer and land in the covered portion, thereby destroying the value of the wafer. Additionally, the devices covering one half the wafer are not adjustable for wafers already having layers of material on them from previous processing.

Yet another problem with existing deposition plates is the lack of means on the deposition plate to remove the wafer with a vacuum wand Another drawback of existing deposition chambers relates to the inability of existing chambers to ensure uniform distribution of the particles being deposited on the wafer. One attempt to overcome this problem is seen in U.S. Pat. No. 4,989,541 to Mikoshiba et al. Mikoshiba et al incorporates a separate nozzle for a "control gas" which encircles the material gas flow and forcibly reorients laterally expanding portions of the material gas flow. The use of such a control nozzle and gas is both expensive and difficult. Moreover, it does not address problems faced when the ionized particles attach to the side walls of the mixing chamber.

Still another drawback relates to the time needed between the processing of each wafer in order to remove previous particles from the chamber. A lengthy amount of time is required between when the particles exit the nozzle and when they reach the base of the deposition chamber.

SUMMARY OF THE INVENTION

It is therefore an object of the present invention to provide a chemical vapor deposition chamber for commercial and research applications.

It is yet another object of the present invention to provide a chemical vapor deposition chamber allowing deposition on the wafer in a uniform manner.

These and other objects of the present invention are provided via a deposition chamber for forming a deposited layer on a wafer having a mixing chamber, a wafer support device for supporting the wafers in the mixing chamber, a nozzle located above the wafer support means which can eject the gas/particle mixture into the mixing chamber toward the wafer, a gas outlet device at the bottom end of the chamber from the nozzle which allows the gas to exit the mixing chamber and a deionizing device located above the wafer(s) to deionize the gas/particle mixture thereby encouraging uniform deposition of the particles on the wafer. This deposition chamber may also comprise an exhaust fan below the gas outlet device.

The wafer support device may comprise a base member having an underside and a topside and having a first recess on the topside sized to fit a semiconductor wafer therein; and a mask member connected to the base member and movable between first and second positions, the first position being where the mask member is positioned over a wafer in the first recess to aid in selective deposition of the particles on the wafer and the second position being where the mask member is raised from said base member relative to said first position for insertion and removal of wafers. The depth of the recess should result in a space of no more than approximately one ten-thousandths of an inch between the mask member and the upperside of the wafer when the mask is in the first position. Whereby, when the mask member is above the recess in the first position there is a distance between the mask member and the semiconductor wafer placed in said first recess for processing of one-ten thousandths of an inch or less.

Additionally, the wafer support means may have a device for spacing the mask from the base member which preferably comprises at least two apertures on either the mask or the base each for receiving a set device so that a portion of the set device extends beyond the topside so that the set device may contact the mask when in the first position thereby providing the ability to maintain a distance between the wafer and the mask when the wafer is thicker than a typical wafer. The device is preferably a set screw. The base member preferably has a second recess deeper than the first recess and extending from the first recess to the edge of the base member. The second recess allows a removing device to access the semiconductor wafer before and after processing thereby avoiding contamination of the processed wafer.

Also disclosed is a deposition chamber for forming a deposited layer on a wafer having a mixing chamber, a wafer support device for supporting the wafer in the mixing chamber, a nozzle located above the wafer support device which can eject the gas/particle mixture into the mixing chamber toward the wafer, a gas outlet device at the opposite end of the chamber from the nozzle for allowing the gas to exit the mixing chamber and an exhaust fan on the other side of the gas outlet device from the nozzle. This chamber may also contain a deionizing device located below the nozzle and above the wafer support device to aid in deionizing the gas/particle mixture thereby encouraging uniform deposition of the particles on the wafer. The wafer support device may comprise a base member having an underside and a topside having a first recess on the topside sized to fit the wafer therein and a mask member connected to the base member and movable between first and second positions, the first position being where the mask member is positioned over a wafer in the first recess to aid in selective deposition of particles on said wafer and the second position being where the mask member is raised from the base relative to the first position for insertion and removal of wafers, the recess being of a depth resulting in a space of no more than approximately one ten-thousandths of an inch between the mask member and the upperside of the wafer in the first position whereby when the mask member is above the recess in the first position there is a distance between the mask member and the semiconductor wafer placed in the recess for processing of one-ten thousandths of an inch or less.

Another deposition chamber comprising a mixing chamber, a wafer support device for supporting the wafer in the mixing chamber comprising a base member having an underside and a topside an having a first recess on the topside sized to fit the wafer therein; and a mask member connected to the base member and movable between first and second positions, the first position being where the mask member is positioned over the first recess to aid in selective deposition of particles on a wafer in the recess and the second position being where the mask member is raised from the base member relative to the first position for insertion and removal of wafers, the recess being of a depth resulting in a space of no more than approximately one ten-thousandths of an inch between the mask member and the upperside of the wafer when in the first position whereby when the mask member is above the recess in the first position there is a distance between the mask member and the semiconductor wafer placed in the recess for processing of one-ten thousandths of an inch or less is disclosed. The chamber also comprises a nozzle located above the wafer support device which can eject the gas/particle mixture into the mixing chamber toward the wafer, and gas outlet device at the opposite end of the chamber from the nozzle for allowing the gas to exit the mixing chamber. This chamber may also include an exhaust fan below the gas outlet device as well as a deionizing device located above the wafer support device to aid in deionizing the gas/particle mixture thereby encouraging uniform deposition of the particles on the wafer.

The mixing chamber may be equipped with a deposition grid capable of holding one or more wafer support devices thereby providing for batch processing.

DETAILED DESCRIPTION OF THE INVENTION

Figure 1:
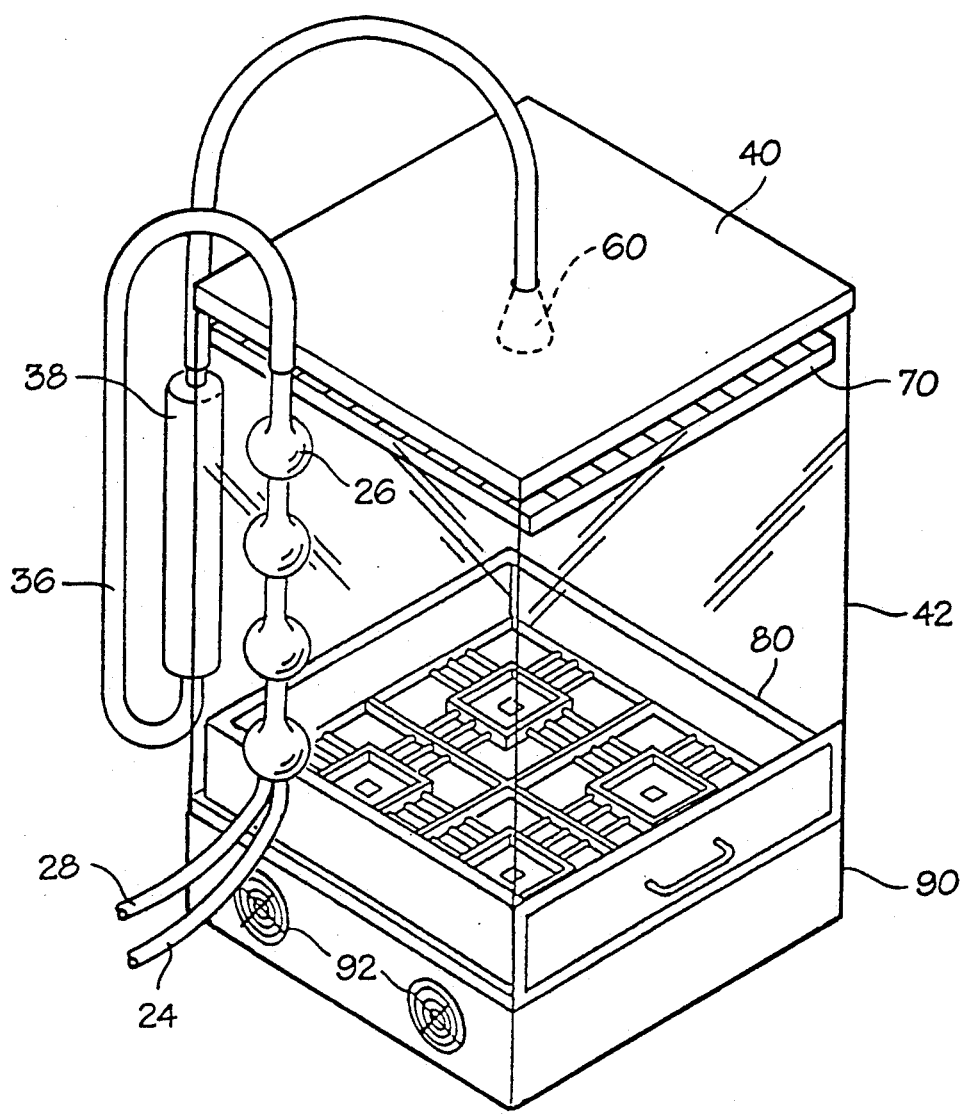
FIG. 1 is a perspective view of a deposition system of the present invention.

Referring now to FIG. 1, a perspective view of one embodiment of a table top deposition system of the present invention is shown. Typically, the mixing chamber 42 is box like in shape and approximately two to three feet high and approximately one to two feet wide. Typically, the walls of the chamber are formed of acrylic plastic. The particles atomized for deposition enter a drying unit 26 via tube 24 to dry the aerosol or vapor and then travel via tube 36 to an optional electrostatic classifier 38 (shown in schematic form). The particles are then deposited within the mixing chamber via a nozzle 60 located near the top of the mixing chamber 40. The mixing chamber 42 of the instant invention also contains a deionizing unit 70 preferably at the top of the mixing chamber in proximity to the nozzle 60. The semiconductor wafers to be processed are placed on a wafer deposition grid 80 which is typically in the form of a drawer as seen in FIG. 1. The grid 80 can be removed from the chamber 42 by removing the drawer from the mixing chamber. The deposition grid 80 sits on top of a base 90. Preferably, inside the base 90 at least one exhaust fan 92 is positioned to encourage quick removal of particles from the mixing chamber 42. One appropriate and preferred exhaust fan is Model 4C549 100 CFM, manufactured by Dayton Company of Chicago, Ill.

Figure 2:
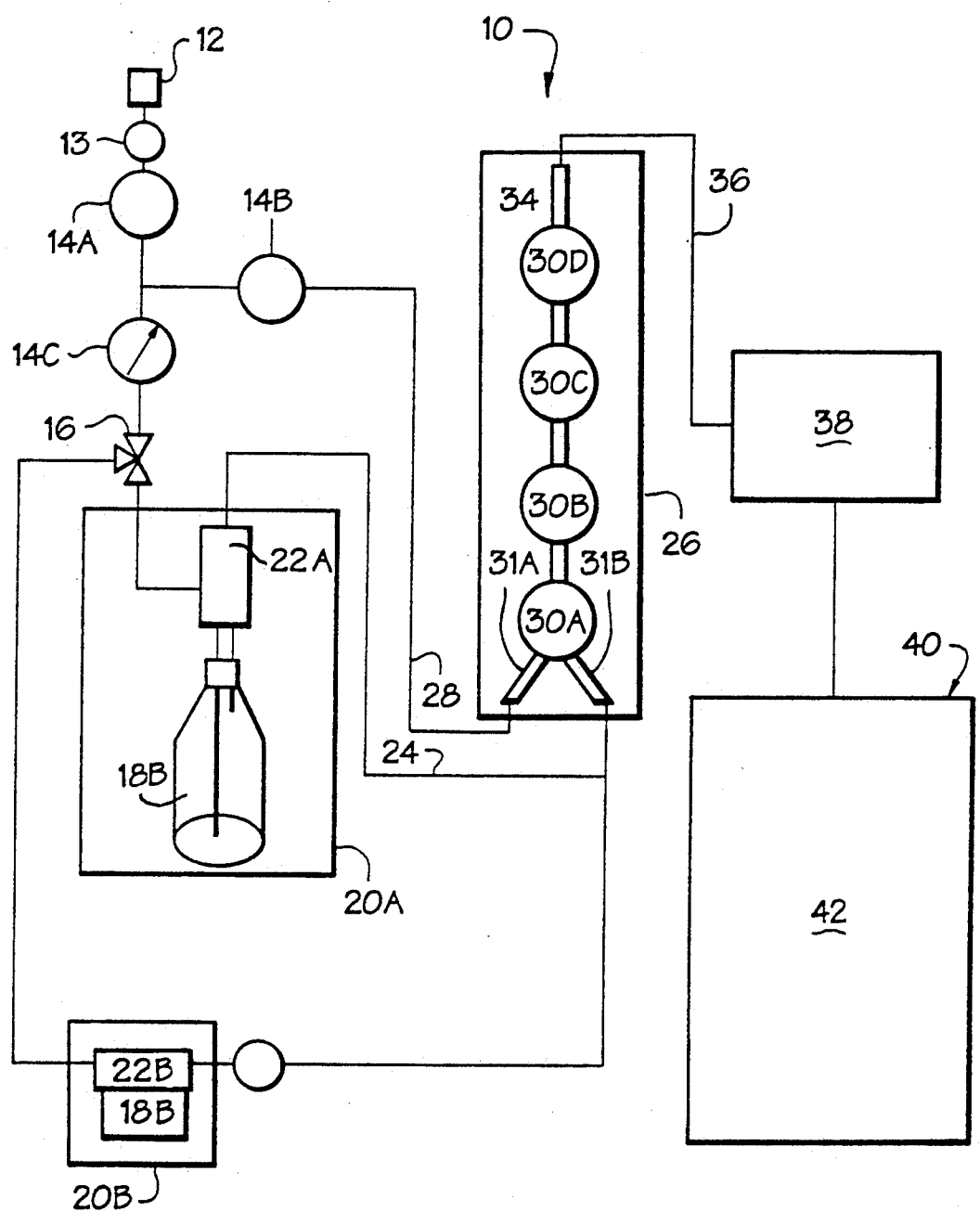
FIG. 2 is a schematic illustration of a deposition system of the present invention.

Referring now to FIG. 2, a schematic of the aerosol generator is shown. The aerosol deposition system may include a filter 12. The filter 12 functions to filter the air used in the atomization and drying processes. Preferably, this filter is Model No. WG2F01HS1, manufactured by Millipore Company of Bedford, Mass. The air may be regulated to control the aerosol moisture content and the velocity of the dry gas/particle mixture through the nozzle via an on-off valve 13 and three gauges with regulators 14A, 14B and 14C as well as a three-way valve 16. The three way valve is used to direct the flow to atomizer 22A or 22B.

The particles to be deposited are placed in a reservoir 18A or B and diluted with deionized water. The PSL spheres are commercially available from a number of sources including Duke Scientific located in Palo Alto, Calif., and Seragen Diagnostics, Inc. The PSL spheres are available in aqueous suspensions containing a small amount of surfactant keeping the spheres from one another. The atomizer forces the diluted suspension through a high velocity jet, or nozzle, to form an aerosol. The jet controls the size of the droplets making up the aerosol; ideally, a droplet contains only one particle for optimal deposition. The atomizer 22 may be any conventional aerosol atomizer but the preferred unit is an atomizer from TSI, Inc., of St. Paul, Minn., Model 9302. This atomizer is preferably used with particles less than 1.0 μm. For particles 1 μm and greater TSI Model 3076A is preferably used for the atomizer. As shown in FIG. 1, both atomizers 22A and 22B and suspension reservoirs 20A and 20B may be employed within the same system to accommodate differing latex sphere sizes.

The aerosol travels via tube 24 and enters drying unit 26 for drying the vapor and the air entering the drying unit through tube 28. The dryer is preferably formed of a series of connected glass bulbs 30A, 30B, 30C and 30D. These bulbs may hold a volume of 50 milliliters and should have an inlet each for the air 31A and 31B for the atomized particles 31B, as well as a single outlet 34 for the dried vapor to exit the dryer.

Next, the dried vapor can be introduced via tube 36 to a conventional electrostatic classifier which uses electrostatic forces to separate incoming particles based on their electric mobility. This provides the benefit of allowing only the specified particle size to enter the chamber. The electrostatic classifier 38 can be used if the particles are less than 0.50 μm, which is the upper size unit of the instrument. Generally, for particles greater than about 0.2 μm, the dried vapor travels directly to the mixing chamber 40 and is introduced to the chamber via single or plural mixing nozzles preferably located at the top 40 of the chamber 42.

Figure 3:
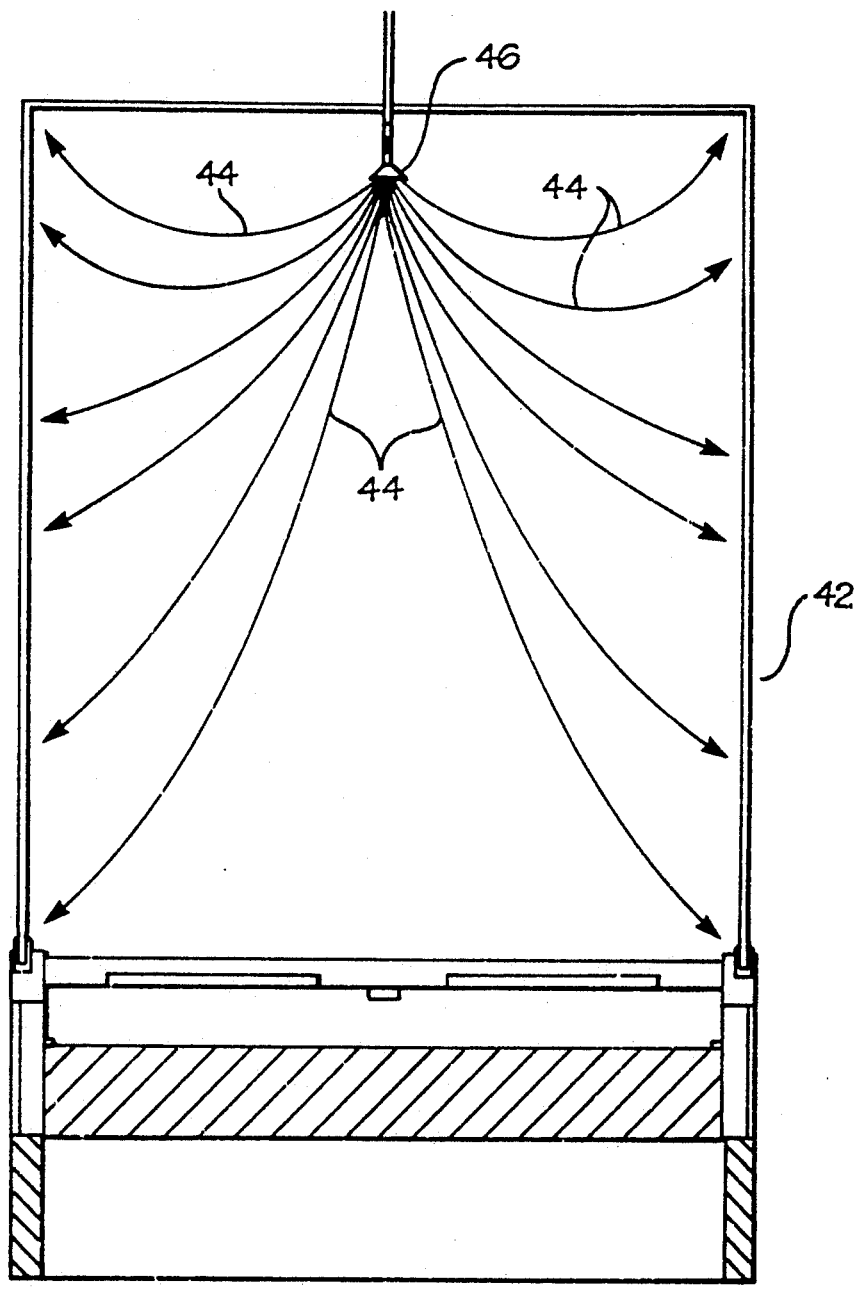
FIG. 3 is an illustration of the general flow of particles within a deposition chamber without the use of an ion emitter.

Upon entering the chamber 42 via the nozzle it is desired that the particles be deposited on the semiconductor wafer in a fast and uniform fashion. However, this is difficult to accomplish as previously discussed. As mentioned, the electrostatic force buildup on the sides of chamber 42 adversely affects the particle flow. FIG. 3 illustrates the effect of this buildup on the particles 44 as they enter the mixing chamber 42 via a conical nozzle 46. The particles are attracted to the interior sides of the mixing chamber 42 due to the electrostatic forces accumulated on the interior sides. The effect of these electrostatic forces on the quality of the deposition is dramatic since quick, uniform and controlled deposition on the wafer being processed cannot be guaranteed.

Figure 4:
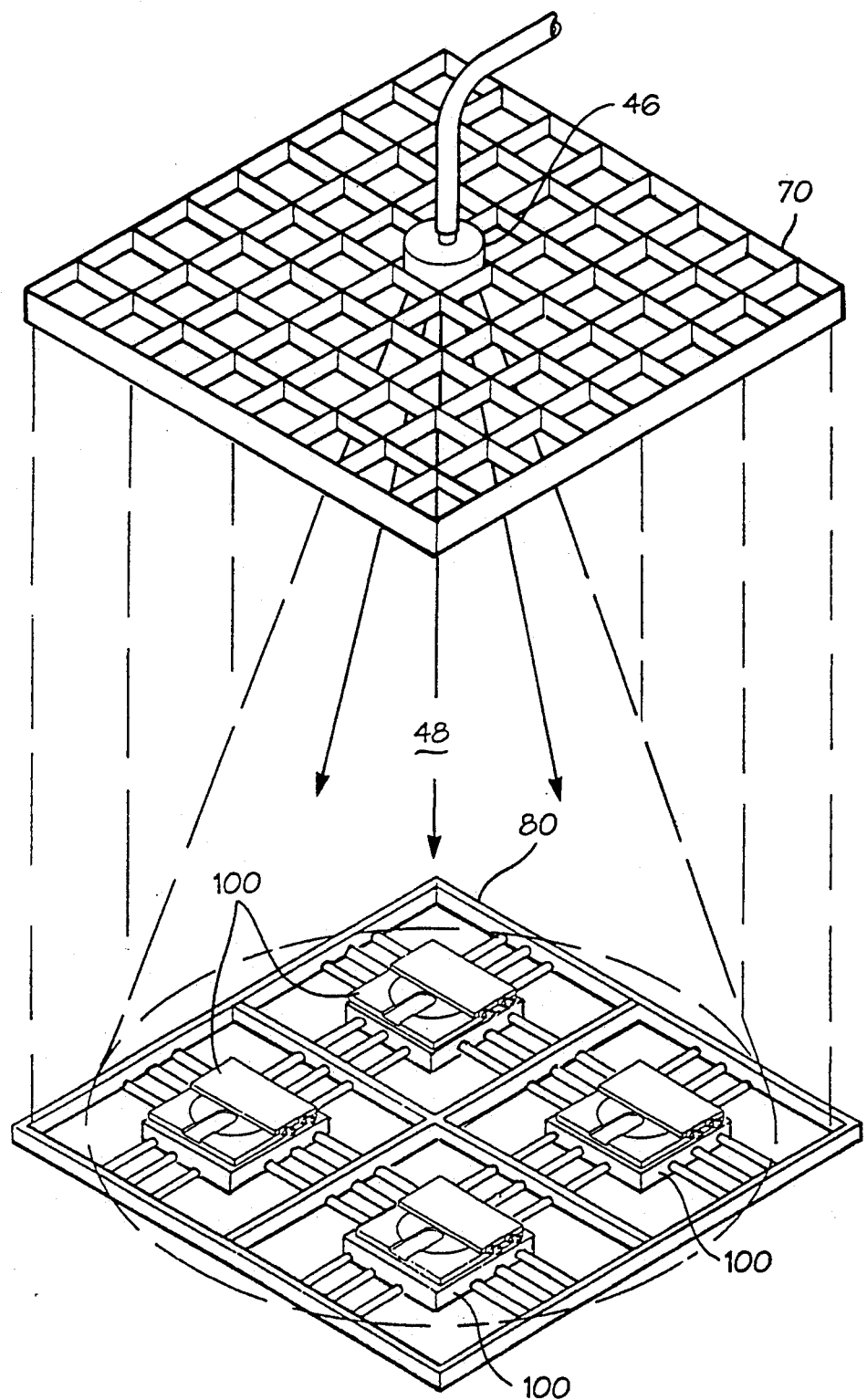
FIG. 4 is an illustration of portions of one embodiment of the deposition chamber of the present invention.

The instant invention avoids the detrimental effect of the electrostatic forces existing on the interior walls of the mixing chamber 42 via the use of a deionizing device 70 placed within the mixing chamber 42 in proximity to the inlet nozzle 46 and, preferably, slightly above the mouth of the nozzle as seen in FIG. 4. The deionizing device 70 neutralizes the particles being deposited on the wafers so that there is no charge on the particles. Consequently, the particles are not drawn to the opposing charge existing on the interior walls of the mixing chamber 42. Thus, if a conical nozzle 46 is employed, the deposition occurs generally in the full cone shaped area 48 shown in FIG. 4. This type of deposition allows for a uniform and controlled deposition over most of the deposition grid 80 and all of the wafer deposition plates 100 even during the batch processing of four wafers as shown in FIG. 4.

The preferred deionizing device 70 is the Envirostat A/C ionization system Model 3422 manufactured by the Simco Company an Illinois Tool Works Company located in Hatfield, Pa. This model is a neutralizing system designed for laminar flow clean rooms and clean benches. The Envirostat A/C system is made up of a number of static neutralizing grids powered by a high voltage a/c power supply. Other suitable ionization systems may also be used.

Figure 5A:
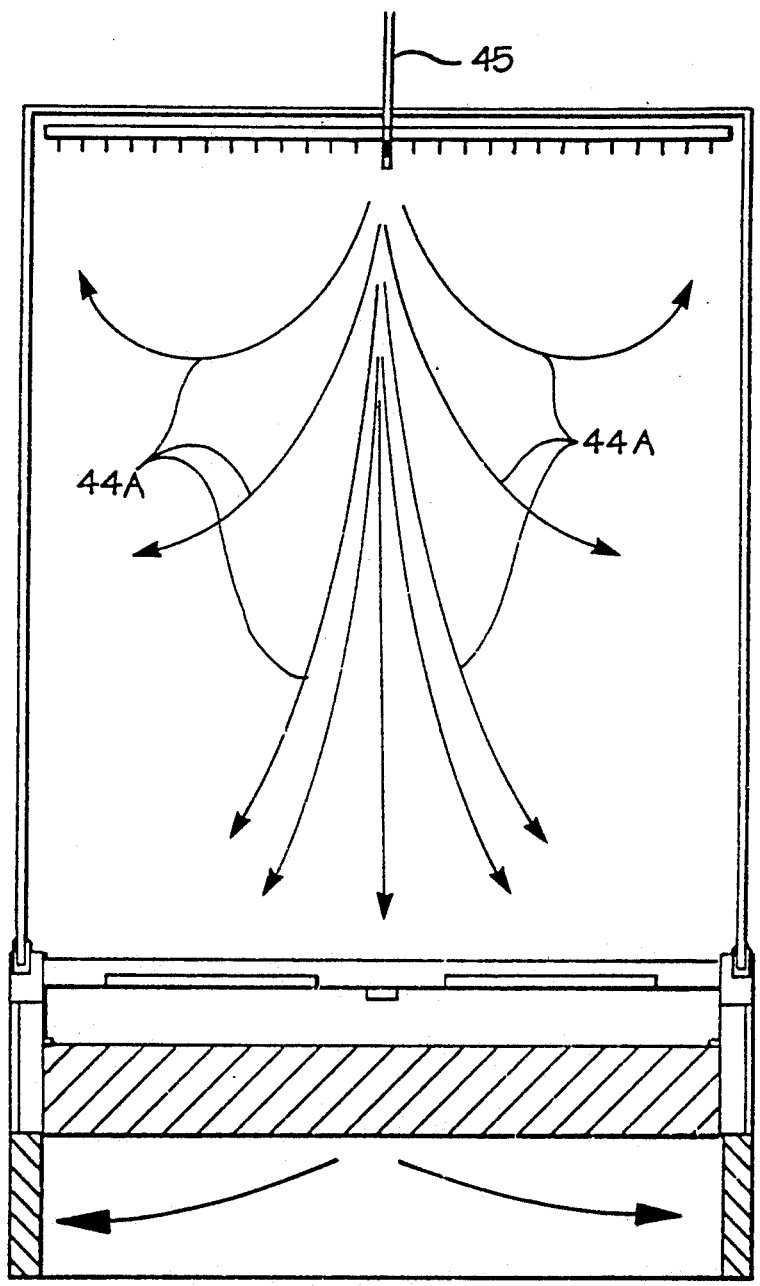
FIG. 5A illustrates the general flow of particles within a conventional deposition chamber of the present invention.
Figure 5B:
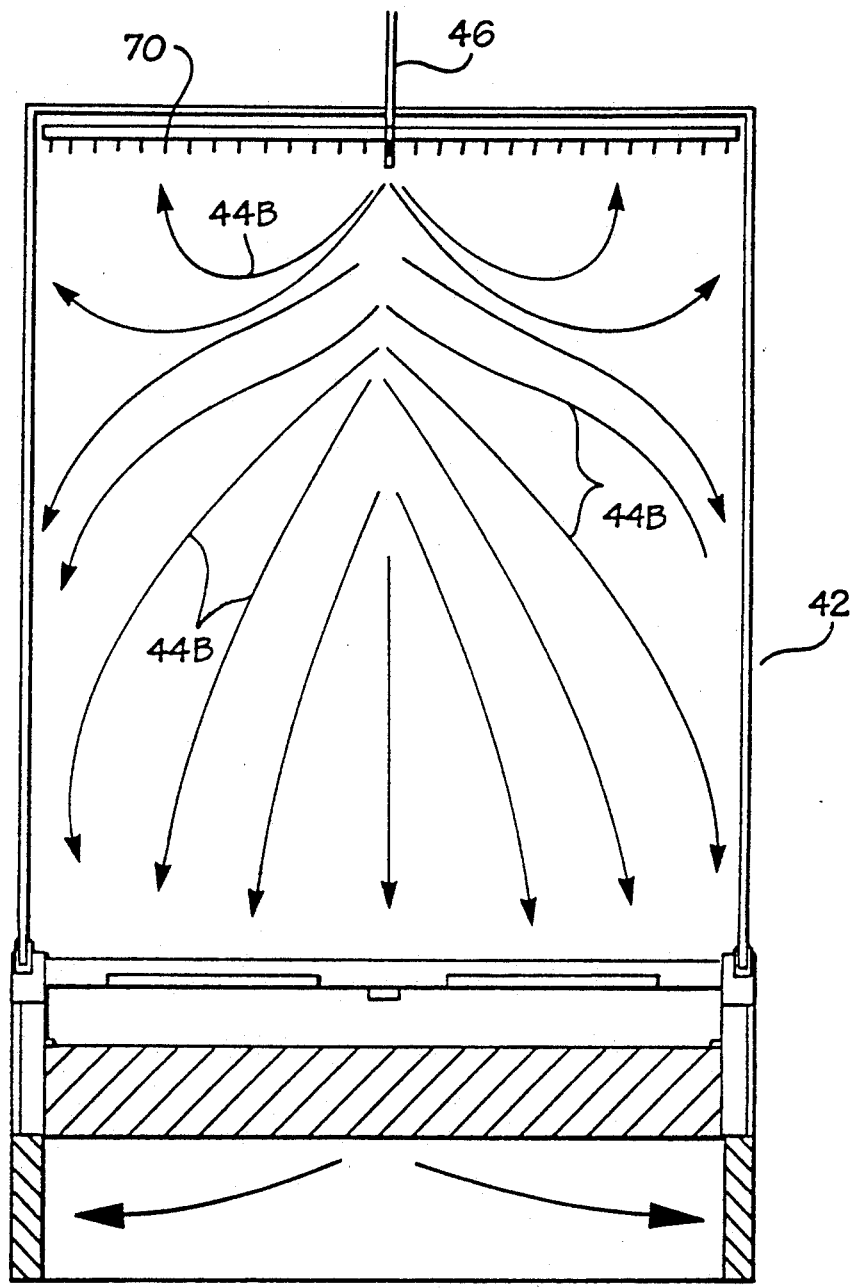
FIG. 5B illustrates the general flow of particles within a deposition chamber of the present invention having an ion emitter.

Referring now to FIGS. 5A and 5B, FIG. 5A illustrates the general flow of particles 44A as the particles enter the mixing chamber via a simple inlet tube 45 when the deionizer unit 70 is in operation. The main concentration of particles occurs in the center of the base of the mixing chamber 42. However, the diameter of the particles reaching the base is not large enough to cover four substrates, such as those shown in FIG. 4 with an even density of particles. In order to obtain a larger diameter at the base, the chamber 42 height and the air velocity of the incoming particles would have to be increased. Such alterations are difficult and impractical. Preferably, as seen in FIG. 5B a full cone nozzle 46 is employed with the operation of the deionizing device 70. A preferred nozzle is Series 460, available from Lechler Company located in St. Charles, Ill. This results in a flow of particles 44B which covers the desired deposition area. The nozzle 46 is selected to complement the atomizers pressure and output and projects the particles downward in a full cone pattern with enough velocity to ensure uniform deposition across the wafers being processed as seen in FIG. 4.

Figure 6:
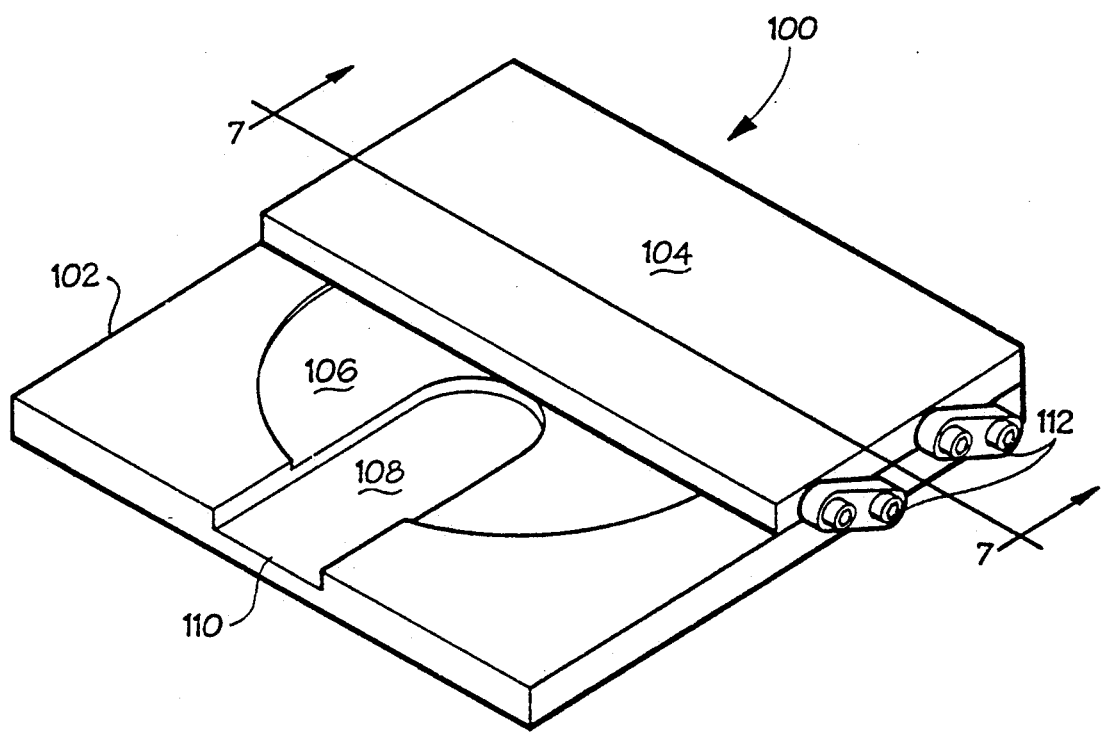
FIG. 6 is a perspective view of one embodiment of a wafer deposition plate of the present invention.

Referring now to FIG. 6, one embodiment of a wafer deposition plate 100 of the present invention is shown. The wafer deposition plate 100 is comprised of a base member 102 and a mask 104 preferably made of a light metal such as aluminum. The base has a recess 106 on its top side which is sized so as to fit a standard 4, 5, 6 or 8 inch semiconductor wafer. The mask is movable between two positions. The first position, shown in FIG. 6, has the mask 104 situated over the recess 106. In the second position (not shown), the mask 104 is not directly over the recess 106.

The recess 106 is fabricated only to be deep enough to leave a one-ten thousandths of an inch or less space between the top side of the wafer placed in recess 106 for processing and the underside of the mask 104. Such a small space prevents particles from rebounding off the portion of the wafer exposed for processing and reaching the surface of the wafer covered by the mask. Thus, the deposition process is uniform and controlled and, therefore, suitable for both research and commercial applications.

As also seen in FIG. 6, a second recess 108 may be located on the top side of base member 102. This recess extends from the interior of the first recess to the edge 110 of the base. This second recess 108 allows for a wafer removal device such as a vacuum wand to be inserted into the recess after processing to enable removal of the wafer from the deposition chamber 42 without contaminating the processed wafer. Thus, the second recess must be deeper than the first recess. The mask 104 may be attached to the base member 102 via any appropriate means including a set of pivot cranks 112 or handles on each side of the mask 104.

Figure 7:
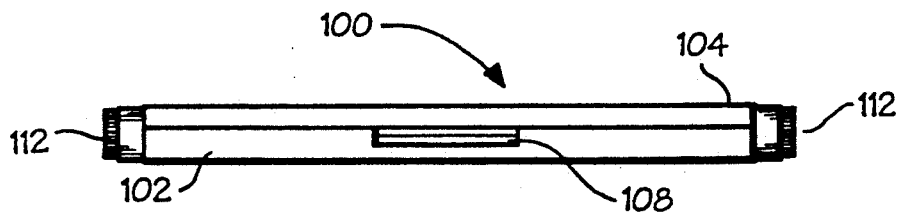
FIG. 7 is a view along line 7—7 of FIG. 5 of one embodiment of the wafer deposition plate of the present invention.
Figure 8:
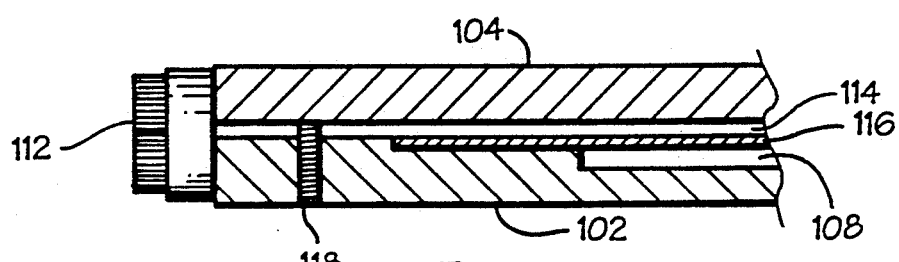
FIG. 8 is an enlarged sectional view of FIG. 7.

A view along line 7—7 of FIG. 6 is shown in FIG. 7. Here, deposition plate 100 is shown having mask 104 in its first position with respect to base member 102. A more detailed sectional view of FIG. 7 is shown in FIG. 8. Here, the small space 114 can be seen between the mask 104 and the semiconductor wafer 116. The tongue like recess 108 for removing the semiconductor wafer is also visible. Another feature of the invention is also seen in FIG. 8, this is a device 118 for adjusting the separation of the mask 104 relative to the wafer 116. The device 118 is used to adjust the height of the mask 104 when the semiconductor wafer 116 is thicker than conventional unprocessed wafers or is a wafer which has already been processed to some degree. The processing layers increase the thickness of the wafer causing the mask 104 to contact the wafer 116. The set device raises the mask 104 to avoid damage to the wafer. Preferably, device 118 are set screws threaded through an aperture in the base 102. Alternatively, device 118 may be set screws threaded through apertures in the mask 104.

Figure 9:
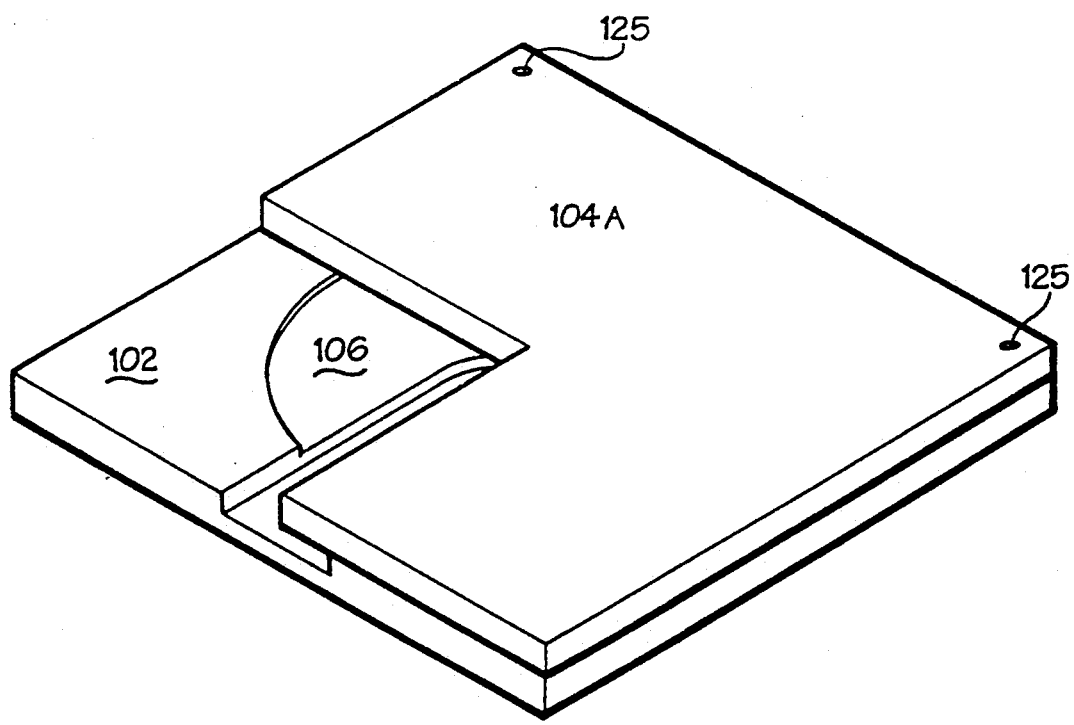
FIG. 9 is a perspective view of a second embodiment of the wafer deposition plate of the present invention.

Another type of mask, a three-quarter mask 104A is shown in FIG. 9. This type of mask can be used when processing is desired only on one-fourth of the semiconductor wafer. The mask may be connected by locator pins 125 located on the base 102 or mask 104 for insertion into corresponding apertures on the mask 104 or base 102. Additionally, handles may be placed on the sides of the base 102 and/or the sides or top of the mask 104 to aid in moving the mask and base.

Figure 10:
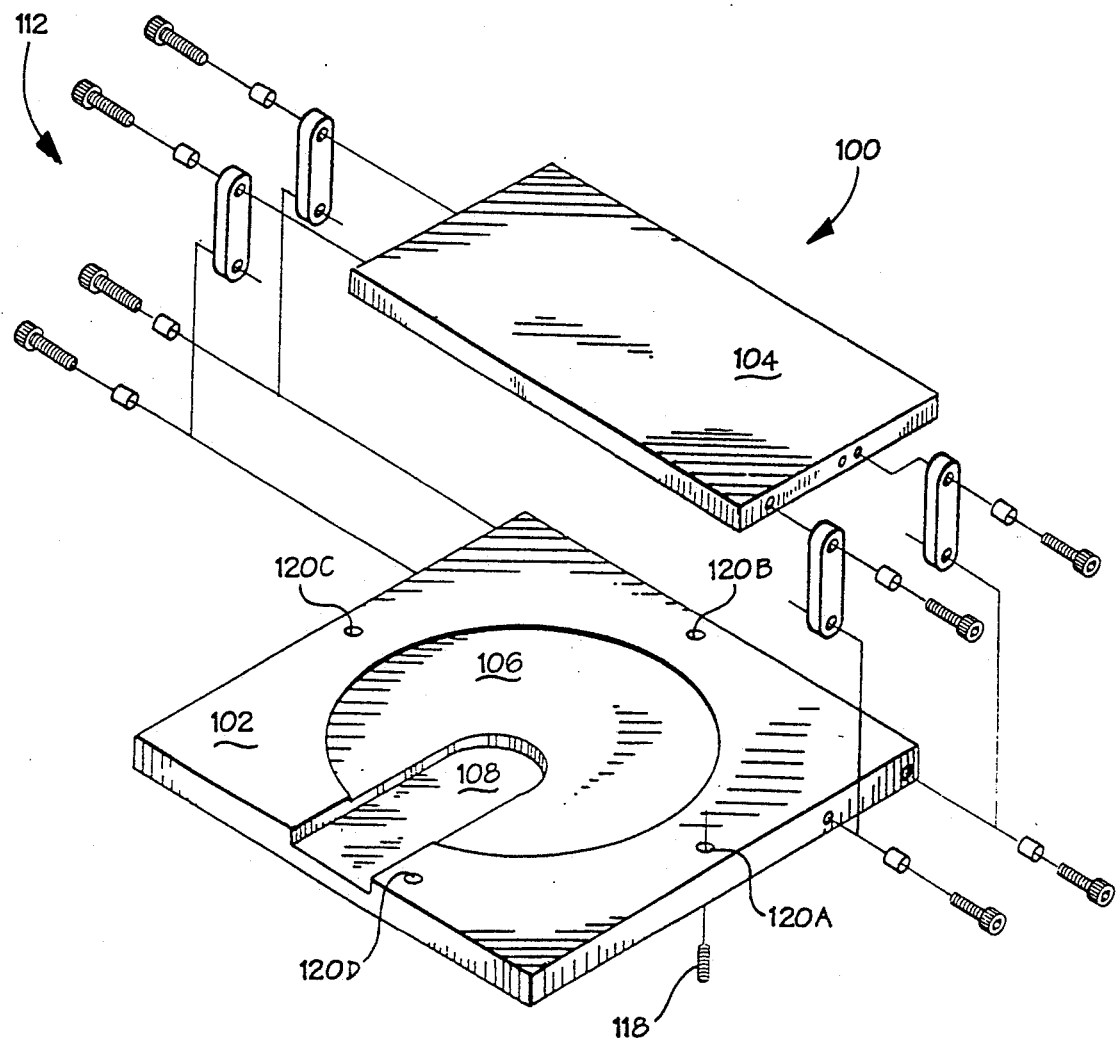
FIG. 10 is an exploded view of one embodiment of a wafer deposition plate of the present invention.

An exploded view of the deposition plate 100 of the present invention is shown in FIG. 10. As previously mentioned with respect to FIG. 8, under certain circumstances the semiconductor wafer may be so thick that when it is placed in recess 106 the wafer touches the mask 104. In these situations a set device 118 can be employed to raise the mask 104. The set device 118 is preferably a set screw 118 which is threaded through apertures 120 to a point slightly beyond the top side of base member 102. When the set device is employed with a half mask such as shown in FIG. 10 set devices 118 are employed with apertures 120A, 120B and 120D to stabilize the mask 104 at a distance of approximately one ten thousandths of an inch away from the surface of the semiconductor wafer. In instances where a three-quarter mask such as the mask 104A shown in FIG. 9 is used all four apertures 120A, B, C and D are employed with the set devices 118.

The invention is applicable to general deposition chambers and, therefore, may also be employed in chemical vapor or other deposition systems.

It will therefore be readily understood by those persons skilled in the art that the present invention is susceptible of a broad utility and application. Many embodiments and adaptations of the present invention other than those herein described, as well as many variations, modifications and equivalent arrangements will be apparent from or reasonably suggested by the present invention and the foregoing description thereof, without departing from the substance or scope of the present invention. Accordingly, while the present invention has been described herein in detail in relation to its preferred embodiment, it is to be understood that this disclosure is only illustrative and exemplary of the present invention and is made merely for purposes of providing a full and enabling disclosure of the invention. The foregoing disclosure is not intended or to be construed to limit the present invention or otherwise to exclude any such other embodiments, adaptations, variations, modifications and equivalent arrangements, the present invention being limited only by the claims appended hereto and the equivalents thereof.

I claim:

1. A deposition chamber for forming a deposited layer on a wafer having an upperside comprising:
   (a) a mixing chamber;
   (b) wafer support means for supporting a wafer in said chamber;

(c) a nozzle located above said wafer support means which can eject a mixture of gas and particles into said mixing chamber toward the wafer;

(d) gas outlet means at the opposite end of said chamber from said nozzle for allowing said gas to exit said chamber; and (e) deionizing means located above said wafer support means for neutralizing said particles and being configured and arranged to facilitate uniform deposition of said particles on said wafer.

2. A deposition chamber according to claim 1 and further comprising exhaust fan means below said gas outlet means.

3. A deposition chamber according to claim 1 wherein said wafer support means comprises a base member having an underside and a topside having a first recess on said topside sized to fit the wafer therein and a mask member connected to said base member and movable between a first position and a second position, said first position being where said mask member is positioned over said first recess to aid in selective deposition of particles on a wafer and said second position being where said mask member is raised from said base member relative to the first position for insertion and removal of said wafer said first recess together with said mask member movement being capable of effecting a space of potentially no more than approximately one ten-thousandths of an inch between said mask member and the upperside of the wafer in said first position; whereby when said mask member is above said recess in said first position there is a distance between said mask member and the semiconductor wafer placed in said recess for processing of one-ten thousandths of an inch or less.

4. A chemical deposition chamber according to claim 3 wherein said base member has at least one aperture for receiving set means so that a portion of said set means extends beyond said topside so that said set means may contact said mask when in said first position thereby providing the ability to maintain a distance between the wafer and said mask when the wafer is thicker than a typical wafer.

5. A chamber according to claim 3 wherein said mask has at least one aperture for receiving set means so that a portion of said set means extends beyond said mask so that said set means may contact said top side of said base when in said first position thereby providing the ability to maintain a distance between the wafer and said mask when the wafer is thicker than a typical wafer.

6. A chamber according to claim 4 wherein said set means comprises a set screw.

7. A chamber according to claim 3 wherein said base member has a second recess being deeper than said first recess and extending from said first recess to an edge of said base member said second recess allowing a device to access the wafer before and after processing.

8. A deposition chamber for forming a deposited layer on a wafer comprising:

(a) a mixing chamber;

(b) wafer support means for supporting a wafer in said chamber;

(c) a nozzle located above said wafer support means which can eject a mixture of gas and particles into said chamber toward the wafer;

(d) gas outlet means at the opposite end of said chamber from said nozzle for allowing said gas to exit said chamber;

(e) deionizing means located above said wafer support means for neutralizing said particles and being configured and arranged to facilitate uniform deposition of said particles on said wafer; and (f) exhaust fan means on the other side of said gas outlet means from said nozzle.

9. A deposition chamber according to claim 8 wherein said wafer support means comprises a base member having an underside and a topside having a first recess on said topside sized to fit the wafer therein and da mask member connected to said base member and movable between a first position and a second position, said first position being where said mask member is positioned over said first recess to aid in selective deposition of particles on a wafer and said second position being where said mask member is raised from said base member relative to said first position for removal and insertion of said wafer said first recess being of a depth resulting in a space of no more than approximately one ten-thousandths of an inch between said mask member and the upperside of the wafer in said first position; whereby when said mask member is above said recess in said first position there is a distance between said mask member and the semiconductor wafer placed in said recess for processing of one-ten thousandths of an inch or less.

10. A deposition chamber for forming a layer on a wafer having an upperside comprising:

(a) a mixing chamber;

(b) wafer support means for supporting a wafer in said chamber and having a base member having an underside and a topside having a first recess on said topside sized to fit the wafer therein and a mask member connected to said base member and movable between a first position and a second position, said first position being where said mask member is positioned over said first recess to aid in selective deposition of particles on a wafer and said second position being where said mask member is raised from said base member relative to said first position for removal and insertion of said wafer, said recess together with said mask member movement being capable of effecting a space of potentially no more than approximately one ten-thousandths of an inch between said mask member and the upperside of the wafer in said first position; whereby when said mask member is above said recess in said first position there is a distance between said mask member and the semiconductor wafer placed in said recess for processing of one-ten thousandths of an inch or less;

(c) a nozzle located above said wafer support means which can eject a mixture of gas and particles into said chamber toward the wafer;

(d) gas outlet means at the opposite end of said chamber from said nozzle for allowing any gas in said chamber to exit said chamber.

11. A deposition chamber according to claim 10 wherein said base member has at least one aperture for receiving a set means from said underside so that a portion of said set means extends beyond said topside so that said set means may contact said mask when in said first position thereby providing the ability to maintain a distance between the wafer and said mask when the wafer is thicker than a typical wafer.

12. A chamber according to claim 11 wherein said set means comprises a set screw.

13. A chamber according to claim 10 wherein said mask has at least one aperture for receiving set means so that a portion of said set means extends beyond said mask so that said set means may contact said top side of said base when in said first position thereby providing the ability to maintain a distance between the wafer and said mask when the wafer is thicker than a typical wafer.

14. A chamber according to claim 10 wherein said base member has a second recess extending from said first recess to an edge of said base member said second recess allowing a device to access the wafer before and after processing.

15. A deposition chamber according to claim 10 and further comprising exhaust fan means below said gas outlet means.

16. A deposition chamber according to claim 10 and further comprising a deionizing device located above said wafer support means for neutralizing said particles and being configured and arranged to facilitate uniform deposition of said particles on said wafer.

17. A chamber according to claim 16 further comprising a set means for provide the ability to maintain a distance between the wafer and said mask.

18. A chamber according to claim 15 wherein said base member has a second recess being deeper than said first recess extending from said first recess to an edge of said base member said second recess allowing a removing device to access the wafer before and after processing.

* * * * *

UNITED STATES PATENT AND TRADEMARK OFFICE
CERTIFICATE OF CORRECTION

PATENT NO. : 5,306,345
DATED : April 26, 1994
INVENTOR(S) : Carrie Pellett and Craig Donaldson It is certified that error appears in the above-identified patent and that said Letters Patent is hereby corrected as shown below:

Title page, item [75] inventors, delete "Pellet" and insert therefor -- Pellett --.

Column 4, line 25, delete "an" (second occurrence) and insert therefor -- and --.

Column 5, line 56, delete "three way" and insert therefor -- three-way --.

Column 10, line 3, delete "configurated" and insert therefor -- configured --.

Column 10, line 11, delete "da" and insert therefor -- a --.

Signed and Sealed this

Thirty-first Day of January, 1995

Attest:

BRUCE LEHMAN

*Attesting Officer*   *Commissioner of Patents and Trademarks*